United States Patent
Garani

(10) Patent No.: US 9,203,434 B1
(45) Date of Patent: Dec. 1, 2015

(54) SYSTEMS AND METHODS FOR IMPROVED ENCODING OF DATA IN DATA STORAGE DEVICES

(75) Inventor: Shayan S. Garani, Irvine, CA (US)

(73) Assignee: Western Digital Technologies, Inc., Irvine, CA (US)

(*) Notice: Subject to any disclaimer, the term of this patent is extended or adjusted under 35 U.S.C. 154(b) by 244 days.

(21) Appl. No.: 13/417,057

(22) Filed: Mar. 9, 2012

(51) Int. Cl.
*H03M 13/11* (2006.01)

(52) U.S. Cl.
CPC .......... *H03M 13/116* (2013.01); *H03M 13/118* (2013.01)

(58) Field of Classification Search
CPC ........................ H03M 13/116; H03M 13/118
See application file for complete search history.

(56) References Cited

U.S. PATENT DOCUMENTS

| | | | |
|---|---|---|---|
| 6,895,547 B2 | 5/2005 | Eleftheriou et al. | |
| 7,072,417 B1 | 7/2006 | Burd et al. | |
| 7,143,336 B1* | 11/2006 | Moon et al. | 714/804 |
| 7,178,080 B2 | 2/2007 | Hocevar | |
| 7,346,832 B2 | 3/2008 | Richardson et al. | |
| 7,395,490 B2 | 7/2008 | Richardson et al. | |
| 7,458,009 B2* | 11/2008 | Yu et al. | 714/800 |
| 7,499,490 B2 | 3/2009 | Divsalar et al. | |
| 7,581,157 B2* | 8/2009 | Oh et al. | 714/781 |
| 7,617,441 B2* | 11/2009 | Lee et al. | 714/800 |
| 7,617,442 B2* | 11/2009 | Shen et al. | 714/801 |
| 7,657,816 B2 | 2/2010 | Cohen et al. | |
| 7,657,824 B2* | 2/2010 | Ha et al. | 714/790 |
| 7,747,934 B2* | 6/2010 | Livshitz | 714/800 |
| 7,814,393 B2 | 10/2010 | Kyung et al. | |
| 7,913,149 B2 | 3/2011 | Gribok et al. | |
| 7,992,066 B2* | 8/2011 | Oh et al. | 714/752 |
| 7,996,746 B2* | 8/2011 | Livshitz et al. | 714/758 |
| 8,065,598 B1* | 11/2011 | Gunnam et al. | 714/800 |
| 8,086,929 B2* | 12/2011 | Chung et al. | 714/752 |

(Continued)

FOREIGN PATENT DOCUMENTS

WO WO2004019268 3/2004

OTHER PUBLICATIONS

Srinivasa, S.; Weathers, A., "An efficient on-the-fly encoding algorithm for binary and finite field LDPC codes," Communications Letters, IEEE, vol. 13, No. 11, pp. 853,855, Nov. 2009.*

(Continued)

*Primary Examiner* — Steve Nguyen

(57) ABSTRACT

Some embodiments of the invention are directed to systems and methods for an optimized and efficient encoding scheme that can accommodate higher block lengths of data. Some embodiments generally relate to: (1) coding structures for a new class of LDPC matrices based on algebraic relations, and (2) encoding method that achieves the $R=1-k/n$ exact bound on code rate. In addition, in some embodiments, the coding structures efficiently create matrices with excellent error-correcting properties and are devoid of short cycles (leading to robust performance). The implementations of the coding structures are scalable over a range of code rates and block lengths.

36 Claims, 8 Drawing Sheets

(56) References Cited

U.S. PATENT DOCUMENTS

| | | | |
|---|---|---|---|
| 8,266,493 B1* | 9/2012 | Abbaszadeh et al. | 714/752 |
| 8,397,125 B2* | 3/2013 | Garani | 714/758 |
| 8,443,254 B2* | 5/2013 | Chung et al. | 714/758 |
| 8,443,257 B1* | 5/2013 | Zeng et al. | 714/758 |
| 2003/0037298 A1 | 2/2003 | Eleftheriou et al. | |
| 2004/0098659 A1 | 5/2004 | Bjerke et al. | |
| 2005/0204253 A1 | 9/2005 | Sukhobok et al. | |
| 2005/0216821 A1 | 9/2005 | Harada | |
| 2005/0246617 A1 | 11/2005 | Kyung et al. | |
| 2006/0036925 A1 | 2/2006 | Kyung et al. | |
| 2006/0036933 A1 | 2/2006 | Blankenship et al. | |
| 2006/0282757 A1 | 12/2006 | Kim et al. | |
| 2009/0031200 A1* | 1/2009 | Olaker et al. | 714/801 |
| 2009/0249159 A1 | 10/2009 | Lee et al. | |
| 2010/0169736 A1 | 7/2010 | Garani | |
| 2010/0211846 A1 | 8/2010 | Matsumoto et al. | |

OTHER PUBLICATIONS

T.R. Oenning, et al., "Low Density Parity Check Coding for Magnetic Recording Channels with Media Noise", Proc. ICC Jun. 2001, vol. 7, pp. 2189-2193.

S.G. Srinivasa, et al., "An Efficient On-the-Fly Encoding Algorithm for Binary and Finite Field LDPC Codes", IEEE. Comm. Letters, vol. 13, No. 11, Nov. 2009, pp. 853-855.

Anand Selvarathinam, et al., "Tiling parity-check matrix for Reduced Complexity High Throughput Low-Density Parity-Check Decoders", Signal Processing Systems Design and Implementation, Nov. 2005, pp. 744-749.

LDPC Codes—A brief Tutorial Bernhard M.J. Leiner, Stud.ID.: 53418L, Apr. 8, 2005, 9 pgs., downloaded from bernh.net/media/download/papers/ldpc.pdf on Mar. 9, 2012.

* cited by examiner 120 120c 122 124 126

$$\begin{bmatrix} 1 & 0 & 0 & 0 \\ 0 & 1 & 0 & 0 \\ 0 & 0 & 0 & 1 \\ 0 & 0 & 1 & 0 \end{bmatrix} \quad \begin{bmatrix} 0 & 1 & 0 & 0 \\ 1 & 0 & 0 & 0 \\ 0 & 0 & 1 & 0 \\ 0 & 0 & 0 & 1 \end{bmatrix} \quad \begin{bmatrix} 0 & 0 & 0 & 1 \\ 0 & 0 & 1 & 0 \\ 1 & 0 & 0 & 0 \\ 0 & 1 & 0 & 0 \end{bmatrix} \quad \begin{bmatrix} 0 & I \\ I^{(1)} & 0 \end{bmatrix}$$

120a — top-left rows; 120b — bottom-left rows; 120d — bottom

FIG. 4A $$\begin{bmatrix} a & 0 & 0 & 0 \\ 0 & 0 & a & 0 \\ 0 & 0 & 0 & a \\ 0 & a' & 0 & 0 \end{bmatrix}$$

130 a, a' indicate populated sub-matrices

FIG. 4B

SYSTEMS AND METHODS FOR IMPROVED ENCODING OF DATA IN DATA STORAGE DEVICES

TECHNICAL FIELD

This disclosure relates to systems and methods for encoding/decoding data in data storage devices.

DESCRIPTION OF RELATED ART

Data storage devices such as solid state drives and hard disk drives are increasing in capacity. These data storage devices rely on complex encoding and decoding schemes in the read/write channels to ensure data integrity. As such, the encoding mechanisms need to adapt to larger individual sector sizes in an efficient manner in order to ensure performance is not adversely affected by the increased storage capacity. Low-Density Parity-Check Code (LDPC) is often used in these data storage devices as part of an error-correction scheme.

BRIEF DESCRIPTION OF THE DRAWINGS

Systems and methods which embody the various features of the invention will now be described with reference to the following drawings, in which:

FIGS. 4A and 4B illustrate example special linear group (SLG)-based matrices according to one embodiment.

DETAILED DESCRIPTION

While certain embodiments of the disclosure are described, these embodiments are presented by way of example only, and are not intended to limit the scope of the disclosure. Indeed, the novel methods and systems described herein may be embodied in a variety of other forms. Furthermore, various omissions, substitutions and changes in the form of the methods and systems described herein may be made without departing from the spirit of the disclosure.

I. Overview

LDPC codes are a class of capacity approaching codes provably for binary erasure channels. Solid state drive (SSD) based LDPC channels are gaining increasing popularity as an alternative to conventional magnetic recording technologies. There is thus a need for constructing new codes and signal processing algorithms to work with these systems. The majority of currently available LDPC code construction codes are tailored for short or moderate block lengths. With the momentum for increased capacity push, to realize increased SNR gains, higher block lengths are needed. This requires efficient encoding methods and simple but effective coding structures to realize decoding and encoding circuitries.

Some embodiments of the invention are directed to systems and methods for an optimized and efficient encoding scheme that can accommodate higher block lengths of data. Some embodiments generally relate to: (1) coding structures for a new class of LDPC matrices based on algebraic relations, and (2) encoding method that achieves the $R=1-k/n$ exact bound on code rate. In addition, in some embodiments, the coding structures efficiently create matrices with excellent error-correcting properties and are devoid of short cycles (leading to robust performance). The implementations of the coding structures are scalable over a range of code rates and block lengths.

II. System Overview

Figure 1:
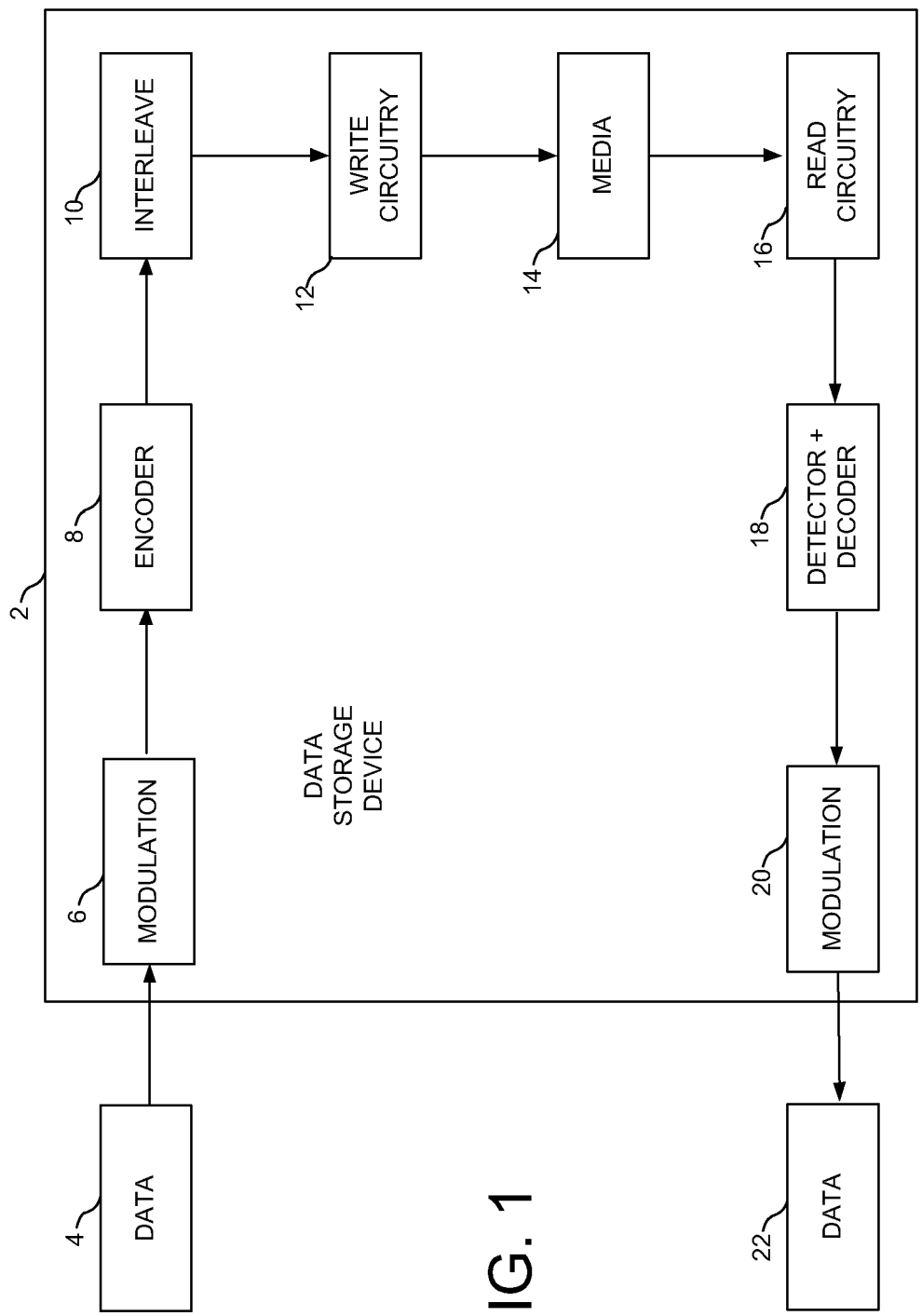
FIG. 1 illustrates a data storage device according to one embodiment.
Figure 2:
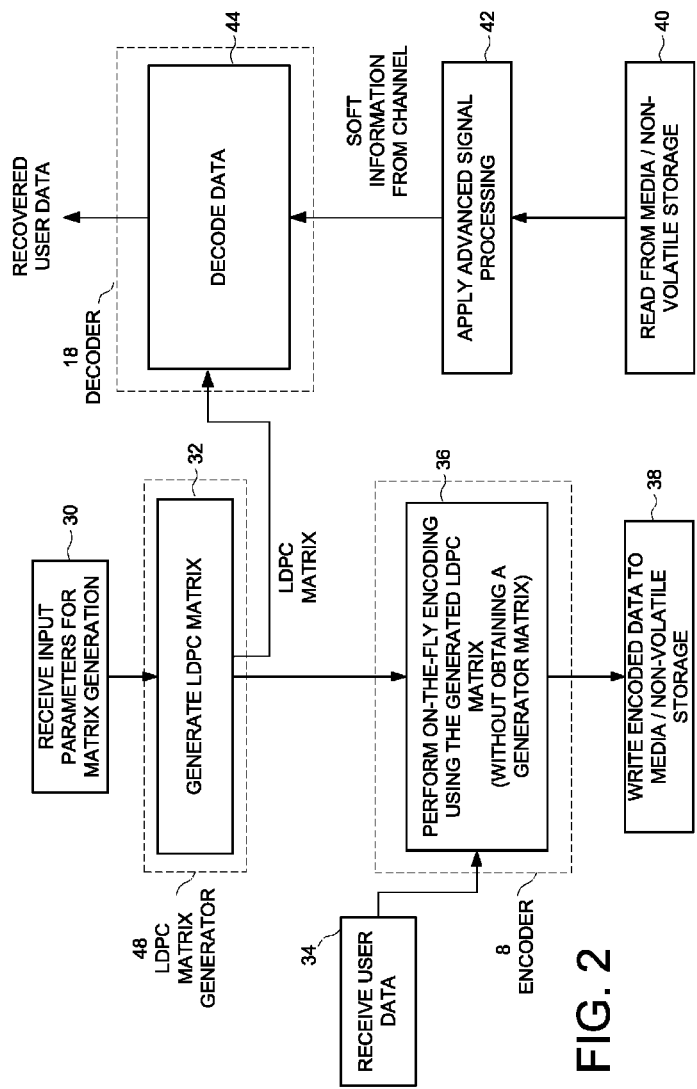
FIG. 2 illustrates a system for encoding and decoding data according to one embodiment.

FIGS. 1 and 2 will provide an overview of the application environment of the LDPC-based encoding schemes according to one or more embodiments. Referring to FIG. 1, an embodiment of data storage device 2 is shown in a logical block diagram representation. The data storage device 2 may be a solid state drive in an embodiment. In another embodiment, the data storage device 2 may be a hard disk drive. As shown, to-be-written data 4 may be received from a host system to which the data storage device 2 is coupled. The host system may be a computing device such as a desktop computer, mobile computer, mobile phone, smartphone, digital camera, communication equipment, etc. Alternatively, the data 4 may be part of an operation that is internal to the data storage device 2, such as a garbage collection or a wear-leveling operation in a solid-state drive. The various components of the data storage device 2 will be referred to generically as "modules," which may comprise circuitry configured to perform certain functions (e.g., via firmware/software). Such circuitry may include microprocessors, FPGAs, ASICs, etc.

In an embodiment, data 4 is processed by a modulation module 6 of the data storage device 2. The modulated data may then be fed to an encoder module 8, and the encoded data may then be processed by an interleave module 10. After processing, the data is sent to write circuitry 12 and written to the media 14. The media 14 may comprise solid state memory (e.g., NAND flash). Alternatively, if the data storage device 2 is a hard disk drive, the media 14 may comprise one or more magnetic disk surfaces. In one or more embodiments, the media 14 may comprise other types of media such as optical disk, Two-Dimensional Media Recording (TDMR), Bit Pattern Media (BPM).

At a later point in time, the written data is read from the media 14 by read circuitry 16. The read data may then be sent to a decoder module 18, which may include a detector sub-module as well. The decoded data may then be processed by a modulation module 20, which may output read data 22. In one embodiment, LDPC matrices are used in the encoding and decoding of the data to ensure that read data 22 is matched with to-be-written data 4.

FIG. 2 is a combined block and flow diagram that illustrates a method of encoding and decoding according to one embodiment. Input parameters 30 are received for matrix generation by a LDPC matrix generator module 48, which generates a LDPC matrix 32. The LDPC matrix generator module 48 may be implemented in control circuitry in a data storage device such as the data storage device 2 shown in FIG. 1. In one embodiment, the generated LDPC matrix is then used in an on-the-fly encoding process 36 to encode user data 34. The encoding is briefly described as follows. Let x:=[u|p] where x is the codeword, u is the user data, and p is the parity. Let the LPDC matrix H:=[A|B] where A and B will be portions of the matrix that will be further described below. Since $Hx^T=0$ for a valid codeword, this means that the user data u can be encoded by computing p as follows.

$$[A \mid B]\begin{bmatrix} u \\ p \end{bmatrix} = 0$$

$$Au+Bp=0$$

$$p=B^{-1}Au$$

Additional details related to the matrix generation of H according to some embodiments are provided in the following sections. In some embodiments, H is generated such that the computation of p can be facilitated without the use of a generator matrix (i.e., encoding of data can be performed on the fly).

In one embodiment, the process 36 is performed by the encoder module 8 of the data storage device 2. This is performed in one or more embodiments without obtaining a generator matrix. These embodiments, which will be further in section II, avoid some of the drawbacks of having to store and use the generator matrix, such as consumption of limited memory space and processing power.

Once encoded, the data is written to the media/non-volatile storage in block 38. The decoding process, which is the decoder module 18 of the data storage device 2 in one embodiment, begins in block 40 when data is read from the media/non-volatile storage. Then in block 42, advanced signal processing is performed on the read data, which results in soft information from the read channel. The soft information is sent to a decoder 26, which uses the same LPDC matrix 32 to recover the user data 46.

II.A. Encoding Schemes

In one embodiment, the LDPC matrix H is decomposed into two parts A and B as follows:

$$H:=[A|B] \quad (1)$$

Embodiments of the invention provide methods for constructing H such that the encoding of data can be performed on-the-fly, without the use of a generator matrix. The following example methods illustrate how matrices A and B can be built to accommodate on-the-fly (OTF) encoding.

II.A.i. Matrix B

In one embodiment, matrix B can be constructed as follows to support OTF encoding. Consider a matrix B of the form:

$$B = \begin{bmatrix} b_{11} & 0 & 0 & 0 \\ 0 & b_{22} & 0 & 0 \\ 0 & 0 & b_{33} & 0 \\ 0 & 0 & 0 & b_{44} \end{bmatrix} \quad (2)$$

Some concepts related to OTF encoding are described in S. G. Srinivasa and A. Weathers, "An efficient on-the-fly encoding algorithm for binary and finite-field based LDPC codes", IEEE. Comm. Letters, vol. 13, pp. 853-855, Nov. 2009, the disclosure of which is hereby incorporated (Srinivasa et al).

One of the conditions for OTF encoding outlined in Srinivasa et al. is that B must have full rank. Based on the example above, sub-matrices $b_{ii}$ can be constructed in one embodiment along the diagonal such that the following additional properties hold:
1) The sub-matrices $b_{ii}$ are themselves full rank over the dimension p×p.
2) The sub-matrices $b_{ii}$ are not necessarily any particular type. They must be however, free of four cycles.
3) The sub-matrices $b_{ii}$ have odd row weight and column weight (even column weight would imply a row reduction to a null row that violates full rank condition (1)).
4) The sub-matrices $b_{ii}$ can be an odd-circulant matrix or any other construction from a linear group.
5) The sub-matrices $b_{ii}$ have to be of column weight>=5 to ensure the necessary protection from error floors and mis-correction. However the matrix A (to be further described below) can be column weight 4 and higher to ensure that the overall H matrix is well behaved (no error floors and mis-corrections).

These additional constraints and constructions relating from properties (1)-(5) are different than those described in Srinivasa et al. and can be used over those described in Srinivasa et al. The prototype mask disclosed in U.S. Pat. App. 2010/0169736 could lead to a lower column weight on the overall matrix, but this is not the case with the example embodiments disclosed here. By contrast, the B matrices generated based on one or more embodiments provide a higher column weight, which provides additional checks for the bits (leading to a more robust system).

The following is an example set of configuration for $b_{11}$, $b_{22}$, $b_{33}$, and $b_{44}$:
$b_{11}$ can be the sum of five circulants $I+I^{(8)}+I^{(11)}+I^{(15)}+I^{(17)}$
$b_{22}$ can be the sum of five circulants $I+I^{(8)}+I^{(11)}+I^{(15)}+I^{(19)}$
$b_{33}$ can be the sum of five circulants $I+I^{(8)}+I^{(11)}+I^{(15)}+I^{(21)}$
$b_{44}$ can be the sum of five circulants $I+I^{(8)}+I^{(11)}+I^{(15)}+I^{(25)}$
The $I^{(k)}$ notation denotes an identity matrix of order p×p that is left/right circularly shifted by k units. Encoding this structure follows from the disclosure above.

II.A.ii. Matrix A

In one embodiment, matrix A can be constructed as follows. In one embodiment, any linear group for permutation matrices as well as multi-column weight based circulant matrices in the design can be used to construct matrix A. Alternatively, in another embodiment, a purely random matrix with the following properties can be used:
a) A by itself is 4-cycle free.
b) A along with B is 4-cycle free.
c) A is not necessarily full rank. But full rank from B ensures that the matrix H is full rank.

The above outlines the procedure for building the matrices as needed.

One example of linear group matrix tiles for A could be as follows $$a_{ij} = \begin{bmatrix} 10100 \\ 00101 \\ 01001 \\ 01010 \\ 11000 \end{bmatrix} \quad (3)$$

Clearly there is no 4-cycle. One can build tiles of such matrices that are not necessarily quasi-cyclic.

In one embodiment, the resultant LDPC matrices (H) constructed using these methods described above are very amenable to 32 kb codeword designs that are suitable in an SSD application. Without these encoding embodiments described herein, a huge burden would be placed on the memory requirements to construct a generator for this purpose and store it. From simple computations, for a native 32 kb, rate 8/9 code with column weight 4 uniformly on matrix A, a sub-matrix size p=8192 would be needed (i.e., $b_{11}$ is of size 8192×8192). This places a memory burden on the system design.

Figure 3:
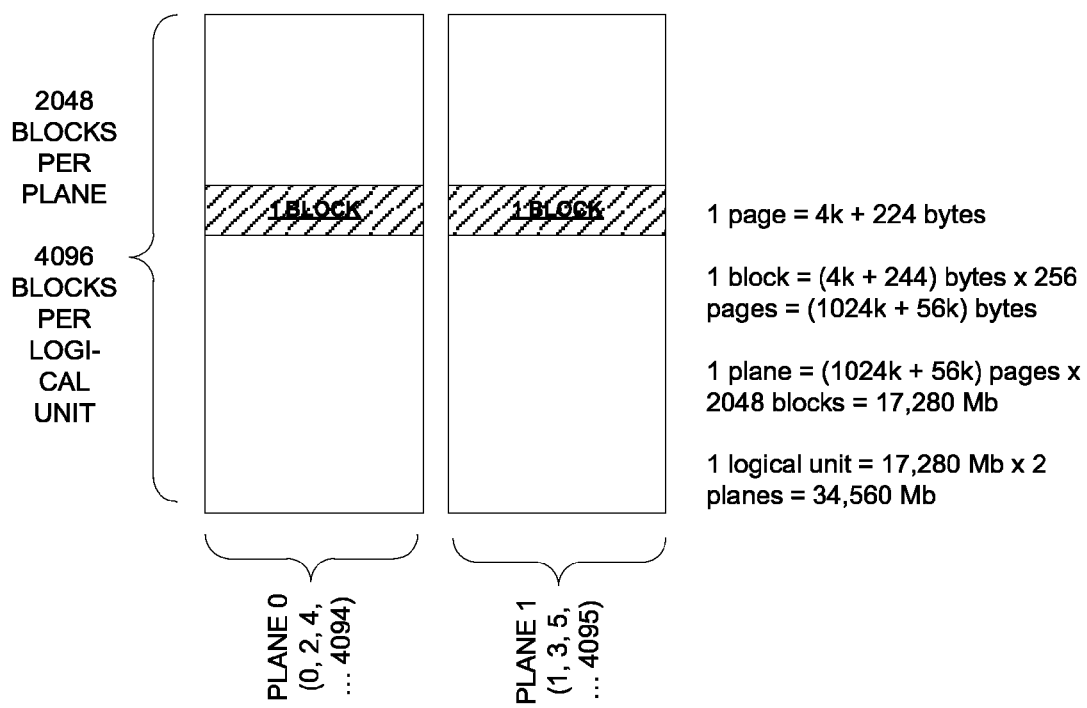
FIG. 3 illustrates an example data organization in a logical unit within a solid state data storage device.

FIG. 3 illustrates an example data organization structure in a SSD NAND flash logical unit according to one embodiment. The figure illustrates the performance of the codes in some embodiments as applied to flash channels. In one embodiment, a 4 k page flash device can be realized as a concatenation of four serially concatenated 1 k bytes of LDPC coded data.

II.A.iii. Special Linear Group

Besides the methods of constructing A outlined above, in one embodiment, matrix A can be constructed based on a special linear group (SLG). FIG. 4A shows some examples SLG-based matrices. A special linear group SLG (p, $F_q$) is a set of p×p matrices with determinant 1 under the group operations of ordinary matrix multiplication. Any invertible matrix can be decomposed into a product of a special unitary matrix and a symmetric matrix over the field $F_q$. Each of the decomposed matrices must separately have a determinant of value '1'. Under the algebraic rules and group arithmetic, matrices from SLG (p, $F_q$) can be conveniently used to form tractable LDPC matrices with good structure and randomness.

Returning to FIG. 4A, note that these matrices are not necessarily quasi-cyclic (the matrices are not just right-shifted identity matrices). The conditions outlined above still hold. Take, for example, matrix 120, which is made up of four sub-matrices 120a, 120b, 120c, and 120d. 120b and 120c are null matrices while 120a is an identity matrix and 120d is a circulant matrix $I^{(1)}$ (an identity matrix right-shifted by one). Matrices 122 and 124 also have the same property, where each is formed with some combination of circulant sub-matrices and null sub-matrices. In matrix 122, its upper left sub-matrix is $I^{(1)}$ and its lower right sub-matrix is I while in matrix 124, its upper right sub-matrix is $I^{(1)}$ and its lower left sub-matrix is I. Matrix 126 is depicted in short-hand form, with the positions of the sub-matrices I and $I^{(1)}$ swapped opposite from those in matrix 124. In one embodiment, the resulting matrix is a permutation matrix.

In one embodiment, the class of SLG-based matrices used for A has the property where it is locally circulant but not globally circulant, as shown by the example matrix 130 in FIG. 4B. Within the matrix, a or a' denotes a sub-matrix that is itself a circulant matrix. In one embodiment, A is constructed using this SLG based method and the resultant matrix A observes the properties set forth in the above sections.

II.B. Coding Structure Example Further Illustrated

As discussed above, certain embodiments are based on a class of matrices based on algebraic structures similar to quasi-cyclic matrices. In some example embodiment, the matrices have the property that the binary modulo sum of row and column co-ordinates with respect to the dimension of the matrix is an element of the finite field group over the size of the matrix. Some embodiments use this basic structure as a tile to form a large sparse LDPC matrix used in the encoding/decoding of data.

The algebraic construction used in one embodiment is further illustrated as follows. In other embodiments, other types of algebraic construction may be used to construct the matrix.

Some embodiments use a coding structure that is based on the following. To obtain a matrix of dimensions p×p, consider a Galois field GF(p). The elements of this group G are:

$$X=\{0,1,\alpha,\alpha^2,\alpha^3,\alpha^4,\alpha^5,\alpha^6,\ldots,\alpha^{2p-2}\}. \quad (4)$$

Let Y denote a mapping from X that represents the binary representation of integers from 0 to p−1. For instance with p=8, consider the following set for Y.

$$Y=f(X)=\{0,1,\alpha,1+\alpha,\alpha^2,1+\alpha^2,\alpha+\alpha^2,1+\alpha+\alpha^2\}. \quad (5)$$

Let β∈X be the constant for this tile of matrix. Let i and j denote the Galois field elements that are bijectively mapped to the row and column indices in the matrix according to the mapping f:X→Y. In one embodiment, a "1" is placed at locations that satisfy the equation $$i+j=\beta \bmod(p(x)). \quad (6)$$

II.B.i. Example

The following is an example matrix generated based on the coding structure set forth above. Consider a matrix of dimensions p×p. With p=8, a primitive polynomial p(x)=1+x+x3 is chosen.

Let β=α+α², then the following matrix follows:

$$M = \begin{bmatrix} 00000010 \\ 00000001 \\ 00001000 \\ 00000100 \\ 00100000 \\ 00010000 \\ 10000000 \\ 01000000 \end{bmatrix} \quad (7)$$

In some embodiments, based on the Galois elements chosen, sub-matrices such as the example M matrix above can be tiled to form a bigger matrix that is compliant with the necessary conditions for the construction of a LDPC matrix with good error correcting abilities.

II.B.ii. LDPC Array Based on the Base Structure

In one embodiment, the LDPC matrix H can be formed by tiling base structures realized from the general procedure described above. Let n and k denote the code length and user lengths of the LDPC code. Let R denote the code rate. This leads to:

$$R = 1 - \frac{gfrank(H)}{n}. \quad (8)$$

With a LDPC matrix H of dimensions (n−k)×n that is tiled from the mother structure described above, this leads to ($n_r$× $n_c$)=⌊(n−k)/p⌋×⌊n/p⌋ such blocks of the mother structure.

II.B.iii. Tiling Process Further Illustrated

Figure 5:
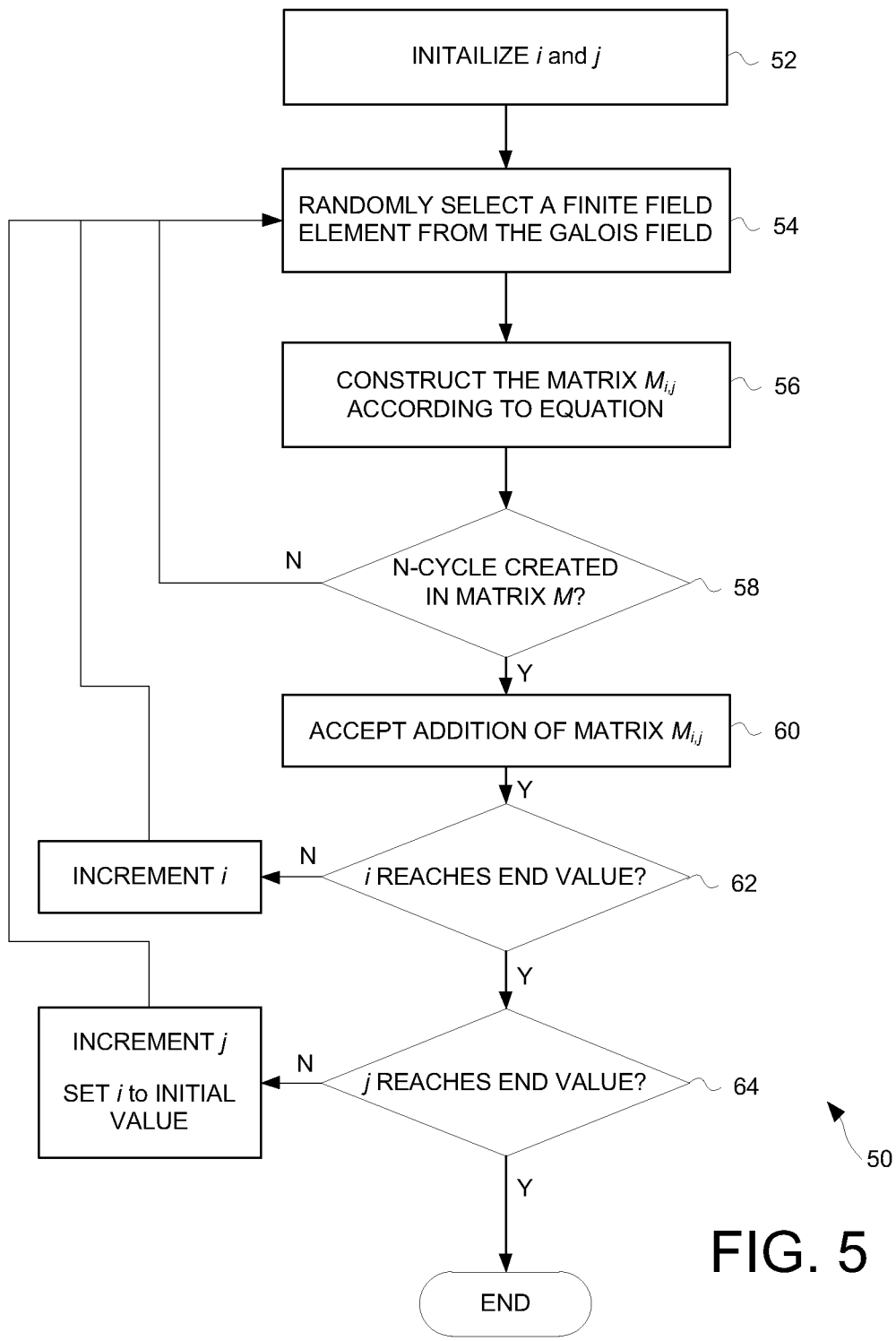
FIG. 5 illustrates a tiling process according to one embodiment.

The tiling process according to one embodiment is illustrated as process 50 in FIG. 5. The process 50 may be executed by the encoder module 18 as shown in FIG. 1. Generally speaking a matrix M may be created by creating individual tiles or sub-matrices $M_{i,j}$, where i is the row index (in blocks/tiles) and j is the column index (in blocks/tiles). At block 52, i and j may be initialized to initial values (to the value 0 or 1, for example). In one embodiment, the tiling process continues until i reaches $n_r$ blocks and j=reaches $n_c$ blocks. In one embodiment, at each iteration, in block 54, the process randomly selects a finite field element $\beta_{i,j} \in GF(p)$. At block 56, the process may construct the sub-matrix or tile $M_{i,j}$ according to equation (6). Note that, in equation (6) above, i and j refer to the indices within the tile or sub-matrix $M_{i,j}$. At block 58, the process may check if the matrix M as constructed in block 56 creates any N-cycle, where N is predetermined. In one embodiment, N=4 to ensure that the overall matrix M has good error correction properties. If so, in one embodiment, the process returns to block 54 and $M_{i,j}$ is constructed again. Otherwise, if no N-cycle is found, the process moves to block 60 which accepts the addition of the newly created sub-matrix or tile $M_{i,j}$. In the embodiment shown in FIG. 5, i is then checked in block 62 to determine if it has reaches an end value (e.g., $n_r$). If not, i is incremented in block 66 and the process repeats blocks 54-60 with the incremented i value. A similar loop is performed for the j value in blocks 64 and 68. In another embodiment, the order of the loop may be reversed with j being incremented in the inner loop and i being incremented in the outer loop. Either way, the end result is the tiling of the overall matrix M when i and j both reach their end values ($n_r$ blocks, $n_c$ blocks). In one embodiment, the process takes at most $\Theta(n_r n_c)$ time steps.

It must be noted that $n_r$ decides the column weight of the matrix and $n_c$ represents the row weight. In order to ensure a balanced tradeoff between performance and complexity, one embodiment may select the parameters accordingly.

$$R \geq 1 - \frac{n_r}{n_c} \quad (9a)$$

$$p = \left\lfloor \frac{n-k}{n_r} \right\rfloor \quad (9b)$$

In other embodiments, the process described above generalizes the construction of quasi-cyclic matrices, as well special structures based on the $q^{th}$ roots of identity matrices $$\sqrt[q]{I},$$

and forms a special linear group structure. In some embodiments, other types of algebraic construction may be used to construct the matrix. For example, the tile may be constructed based on permutation matrices. In some cases, the individual tiles need not be a cyclic permutation matrix, as long as each tile can be expressed in an algebraic construction, e.g., as discussed above with respect to the special linear group.

The following results are stated without proof.
Proposition 1: For 4-cycle free construction i.e., girth(H)≥6, for row indices p, q and column indices m, n the following result holds:

$$\beta_{p,m} - \beta_{q,m} \neq \beta_{p,n} - \beta_{q,n} \bmod p(x). \quad (10)$$

Figure 6A:
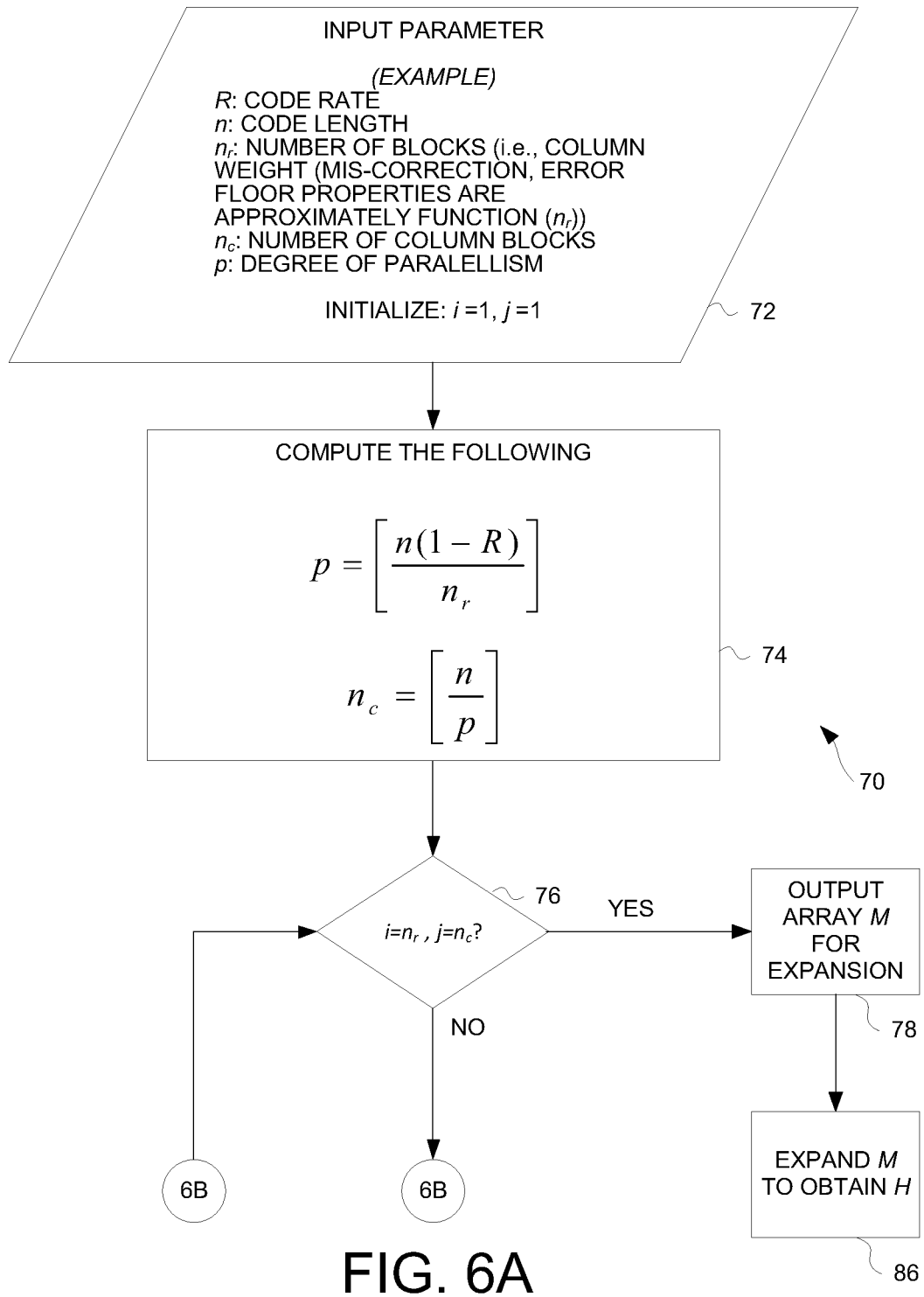
FIGS. 6A and 6B illustrate a process for using LPDC according to one embodiment.
Figure 6B:
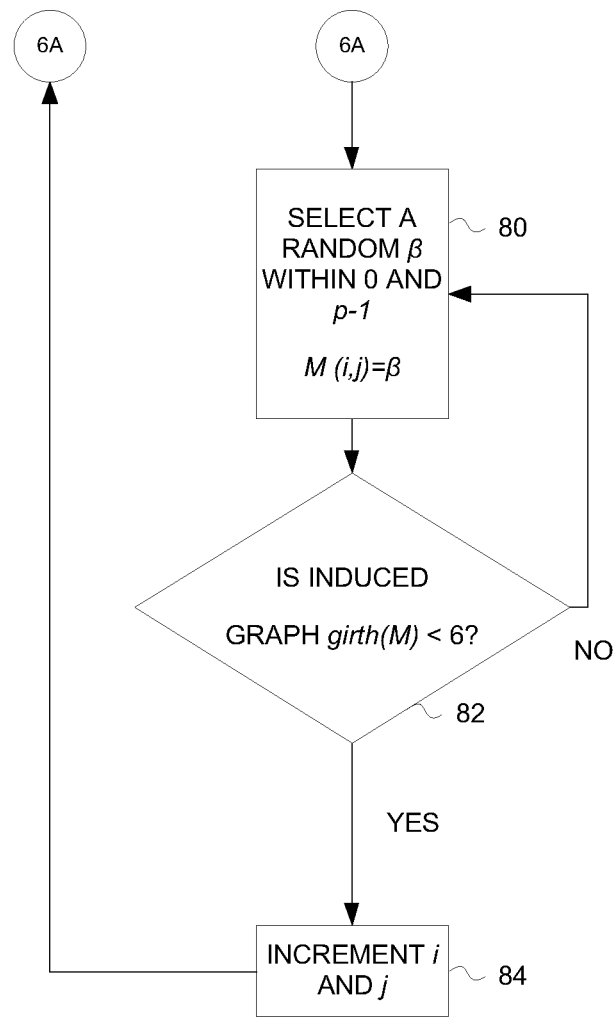

FIGS. 6A and 6B further illustrate a process 70 of tiling according to one embodiment. The process 70 may be executed by the encoder module 18 as shown in FIG. 1. A number of input parameters are received in block 72. Example input parameters include:
R: code rate
n: code length
$n_r$: number of blocks (i.e., column weight (mis-correction, error floor properties are approximately function ($n_r$))
$n_c$: number of column blocks
p: degree of parallelism In block 74, p and $n_c$ are computed according to equations shown in FIG. 6A. Then the iterations of tiling begin in blocks 76-84 over the range of values of row index i and column index j. The inner and outer loops of row and column iterations are simplified here into blocks 76 and 84. At each iteration for a given i and j, in block 80, the process inserts the individual tile by selecting a random $\beta$ within 0 and p−1 so that $M(i,j)=\beta$. In one embodiment, $\beta$ is the value of the right shift of the identity matrix. In other embodiments, $\beta$ could be selected based on the coordinate i and j, or based on a SLG scheme outlined above. In block 82, the process checks whether the induced graph girth(M) is less than 6. For example, the check could be performed based on the condition outlined in Proposition 1 above, or if necessary, by expanding the tile(s) in question. If so, the tiling continues with the next iteration. If not, block 80 is repeated again.

Once an array M of size $n_r \times n_c$ is generated (block 78), the matrix H of size $pn_r \times pn_c$ in one embodiment is formed by expanding M (block 86) such that for a value M(i,j), a zero-one block matrix N of dimension p×p is constructed such that a '1' is placed in locations N(a,b) in which $$a+b \equiv \beta \bmod(p(x)) \quad (11)$$

where p(x) is a primitive polynomial. Based on this, a tile of block matrices N of size p×p over each entry in M of size $n_r \times n_c$ yields the LDPC matrix H of size $pn_r \times pn_c$. This completes the tiling procedure for generating LDPC matrices. The matrix has a very nice algebraic structure equivalent to a scrambled on its row and column sub-blocks and generalizes quasi-cyclic structure. This construction can be generalized very easily to construct finite-filed based or non-binary LDPC matrices.

II.C. On-the-Fly Encoding Example

Figure 7A:
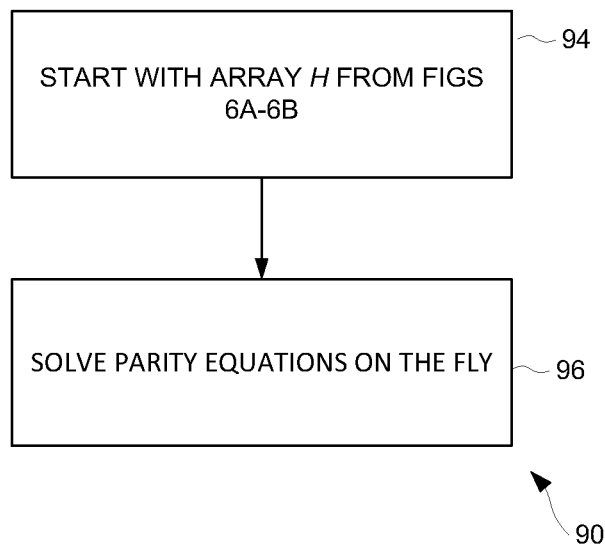
FIG. 7A illustrates an on-the-fly application according to one embodiment.

FIG. 7A illustrates an on-the-fly application according to one embodiment. The process 90 may be executed by the encoder module 18 as shown in FIG. 1. Block 94 begins with the array H generated from FIGS. 6A and 6B. Then in block 96, parity equations are solved on the fly.

To illustrate the OTF solution, consider a systematic code construction H:=[A|B] where A,B are characterized by matrix structures that are populated from entries based on the code construction described in section II.B. In one embodiment, the matrix B is constructed such that the following equation holds $$\text{gfrank}(H) = \text{gfrank}(B). \quad (12)$$

In order that equation (12) holds, in one embodiment null block matrices are introduced within B resulting in reduced column weight over the region of the parity portion of the code. This leads to full rank condition with $B^{-1}$ readily computable that facilities easy encoding.

Furthermore, in one embodiment, suppose u denotes a block of user bits. The parity vector can be easily constructed as $$p = B^{-1} A u \quad (13)$$

Equation (13) is readily solvable as a set of block matrices using the procedure described in the work described in the above referenced publication Srinivasa et al.

Figure 7B:
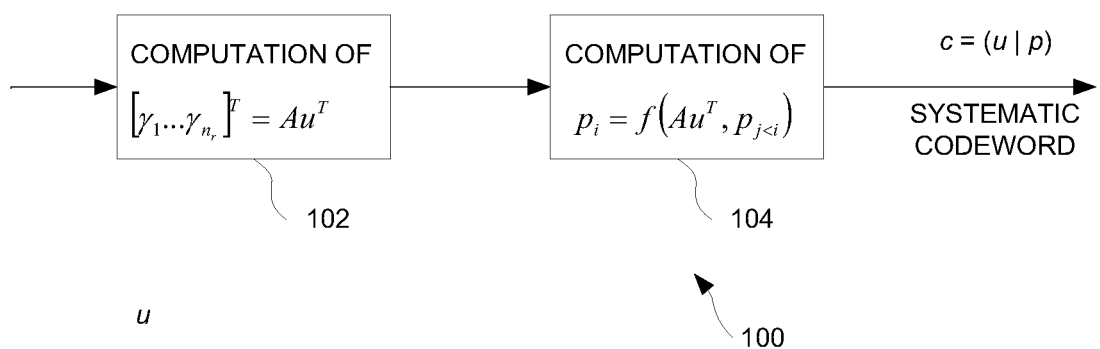
FIG. 7B illustrates an encoder according to one embodiment.

FIG. 7B shows a schematic of the encoder blocks 102 and 104 that can work with these matrices according to one embodiment. When user data u is received at block 102, it is encoded according to the equation shown. Then in block 104, the systematic codeword is computed according to the equation shown. Decoding can be done similarly using standard architectures such as the min-sum decoding engine.

III. Benefits

Some of the benefits and advantages of one or more embodiments include:

With the design conditions described, an almost scrambled sparse LDPC array can be constructed that satisfies the girth constraints. Thus, by a careful choice of parameters for tiling the matrix, coding structures that preclude any interleaver in the turbo-equalized system can be obtained. The interleaver can be a bottleneck for throughput at the encoding and decoding sides due to latencies proportional to the code length. Careful choice yields almost 6× speed up in throughput due to elimination of interleavers in the data storage system.

The encoding structures described in one or more embodiments above goes well with this code construction and can be either done on-the-fly or by obtaining a generator matrix depending on the performance-complexity tradeoffs. Encoding on-the-fly is done in linear time complexity and eliminates the need to store generator matrices. In one example embodiment, this achieves a saving of roughly 1010 bits of memory considering an example 32 kb system.

For SSD channels, embodiments of data storage systems employing these LDPC code structures can yield about 7.5 dB SNR gain over a comparable BCH code.

CONCLUSION

Alternative Embodiments

While certain embodiments have been described, these embodiments have been presented by way of example only, and are not intended to limit the scope of the disclosure. Indeed, the novel methods and systems described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

For example, those skilled in the art will appreciate that in various embodiments, the actual steps taken in the processes shown in FIGS. 2-7 may differ from those shown in the figures. Depending on the embodiment, certain of the steps described in the example above may be removed, others may be added, and the sequence of steps may be altered and/or performed in parallel. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

The invention claimed is:

1. A method of encoding data to be stored in a data storage device, the method comprising:
creating a Low Density Parity Check (LDPC) matrix H from a matrix A and a matrix B, the matrix B comprising a plurality of sub-matrices $b_{ij}$ in a diagonal of the matrix B, wherein i is a row index of the matrix B and j is a column index of the matrix B, wherein the plurality of sub-matrices $b_{ij}$ are full rank, are free of 4-cycles, and have odd row weight and column weight, wherein the plurality of sub-matrices $b_{ij}$ form a full rank matrix which includes only elements of a single diagonal of the matrix B, wherein all of the elements of the matrix B except for $b_{ij}$ (i=j) are zero, and wherein the matrix B is a 4×4 matrix, wherein the submatrices $b_{ij}$ include $b_{11}$, $b_{22}$, $b_{33}$, and $b_{44}$, wherein $b_{11}$ is the sum of five circulants $I+I^{(8)}+I^{(11)}+I^{(15)}+I^{(17)}$, wherein $b_{22}$ is the sum of five circulants $I+I^{(8)}+I^{(11)}+I^{(15)}+I^{(19)}$, wherein $b_{33}$ is the sum of five circulants $I+I^{(8)}+I^{(11)}+I^{(15)}+I^{(21)}$, wherein $b_{44}$ is the sum of five circulants $I+I^{(8)}+I^{(11)}+I^{(15)}+I^{(25)}$, and wherein $I^{(k)}$ notation denotes an identity matrix of order p×p that is left or right circularly shifted by k units;
receiving write data;
encoding the write data on-the-fly using the matrix H; and
writing the encoded write data in a non-volatile storage medium in the data storage device.

2. The method of claim 1, wherein the matrix H has a characteristic of having a code rate R that meets a boundary of R=1−k/n, where k is the number of rows in the matrix H and represents a user data length for the write data, and n is the number of columns and represents a code length for the write data.

3. The method of claim 1, wherein the matrix A is formed of a combined linear group for permutation matrices.

4. The method of claim 1, wherein the matrix A is formed using multi-column weight based circulant matrices.

5. The method of claim 1, wherein the matrix A is 4-cycle free.

6. The method of claim 1, wherein creating the matrix H comprises iteratively generating tiles of the matrix H.

7. The method of claim 6, wherein at least some of the tiles are generated according to an algebraic expression.

8. The method of claim 6, wherein at least some of the tiles are generated according to a selection from a special linear group of matrices.

9. The method of claim 6, wherein at least some of the tiles are generated according to a selection from a right-shifted version of an identity matrix.

10. The method of claim 6, wherein at least some of the tiles are generated according to a plurality of right-shifted versions of an identity matrix.

11. The method of claim 6, wherein each of the tiles of the matrix H is iteratively generated according to the following:
for an element located at (k, l) within a current tile of the matrix H where k is a row index within the current tile and l is a column index within the current tile, assigning:
a value of '0' to the element in the current tile, unless a sum of Galois Field GF(p) elements i and j is equivalent to β mod (f(x)), then assigning a value of '1' to the element in the current tile, where:
β is a finite field element selected from the Galois Field GF(p), p being a number of elements per row of the current tile or a number of elements per column of the current tile; and f(x) is a pre-determined polynomial function that represents a mapping of the elements i and j to k and l.

12. The method of claim 6, wherein creating the matrix H further comprises checking if a current tile creates in the matrix H any cycle of length of at least 4, and if so, generating a new current tile.

13. The method of claim 1, wherein each element in the matrix H is a binary value.

14. The method of claim 1, wherein at least one element in the matrix H is a non-binary value.

15. The method of claim 1, wherein the non-volatile storage medium comprises a magnetic storage medium.

16. The method of claim 1, wherein the non-volatile storage medium comprises non-volatile semiconductor memory.

17. The method of claim 1, wherein the matrix H is full rank.

18. A data storage device comprising:
a non-volatile data storage medium; and
control circuitry configured to implement an encoder for data to be stored on the non-volatile data storage medium, the encoder configured to:
create a Low Density Parity Check (LDPC) matrix H from a matrix A and a matrix B, the matrix B comprising a plurality of sub-matrices $b_{ij}$ in a diagonal of the matrix B, wherein i is a row index of the matrix B and j is a column index of the matrix B, wherein the plurality of sub-matrices $b_{ij}$ are full rank, are free of 4-cycles, and have odd row weight and column weight, wherein the plurality of sub-matrices $b_{ij}$ form a full rank matrix which includes only elements of a single diagonal of the matrix B, wherein all of the elements of the matrix B except for $b_{ij}$ (i=j) are zero, and wherein the matrix B is a 4×4 matrix, wherein the submatrices $b_{ij}$ include $b_{11}$, $b_{22}$, $b_{33}$, and $b_{44}$, wherein $b_{11}$ is the sum of five circulants $I+I^{(8)}+I^{(11)}+I^{(15)}+I^{(17)}$, wherein $b_{22}$ is the sum of five circulants $I+I^{(8)}+I^{(11)}+I^{(15)}+I^{(19)}$, wherein $b_{33}$ is the sum of five circulants $I+I^{(8)}+I^{(11)}+I^{(15)}+I^{(21)}$, wherein $b_{44}$ is the sum of five circulants $I+I^{(8)}+I^{(11)}+I^{(15)}+I^{(25)}$, and wherein $I^{(k)}$ notation denotes an identity matrix of order p×p that is left or right circularly shifted by k units;
receive write data;
encode the write data on-the-fly using the matrix H; and
write the encoded write data to the non-volatile data storage medium.

19. The data storage device of claim 18, wherein the matrix H has a characteristic of having a code rate R that meets a boundary of R=1−k/n, where k is a number of rows in the matrix H and represents the user data length for the write data, and n is the number of columns and represents the code length for the write data.

20. The data storage device of claim 18, wherein the matrix A is formed of a combined linear group for permutation matrices.

21. The data storage device of claim 18, wherein the matrix A is formed using multi-column weight based circulant matrices.

22. The data storage device of claim 18, wherein the matrix A is 4-cycle free.

23. The data storage device of claim 22, wherein the matrix A is not full rank.

24. The data storage device of claim 18, wherein the encoder is further configured to create the matrix H by iteratively generating tiles of the matrix H.

25. The data storage device of claim 24, wherein at least some of the tiles are generated according to an algebraic expression.

26. The data storage device of claim 24, wherein at least some of the tiles are generated according to a selection from a special linear group of matrices.

27. The data storage device of claim 24, wherein at least some of the tiles are generated according to a selection from a right-shifted version of an identity matrix.

28. The data storage device of claim 24, wherein at least some of the tiles are generated according to a plurality of right-shifted versions of an identity matrix.

29. The data storage device of claim 24, wherein each of the tiles of the matrix H is iteratively generated according to the following:
for an element located at (k, l) within a current tile of the matrix H where k is a row index within the current tile and l is a column index within the current tile, assigning:
a value of '0' to the element in the current tile, unless
a sum of Galois Field GF(p) elements i and j is equivalent to β mod (f(x)), then assigning a value of '1' to the element in the current tile, where:
β is a finite field element selected from the Galois Field GF(p), p being a number of elements per row of the current tile or a number of elements per column of the current tile; and
f(x) is a pre-determined polynomial function that represents a mapping of the elements i and j to k and l.

30. The data storage device of claim 24, wherein the encoder is further configured to create the matrix H by checking if a current tile creates in the matrix H any cycle of length of at least 4, and if so, generating a new current tile.

31. The data storage device of claim 18, wherein each element in the matrix H is a binary value.

32. The data storage device of claim 18, wherein at least one element in the matrix H is a non-binary value.

33. The data storage device of claim 18, wherein the non-volatile storage medium comprises a magnetic storage medium.

34. The data storage device of claim 18, wherein the non-volatile storage medium comprises non-volatile semiconductor memory.

35. The data storage device of claim 18, wherein the plurality of sub-matrices $b_{ij}$ are based on an odd-circulant matrix.

36. The data storage device of claim 18, wherein the matrix H is full rank.

* * * * *